(12) United States Patent
Rajoo et al.

(10) Patent No.: US 11,652,069 B2
(45) Date of Patent: May 16, 2023

(54) CRACKSTOP STRUCTURES

(71) Applicant: GLOBALFOUNDRIES Singapore Pte. Ltd., Singapore (SG)

(72) Inventors: Ranjan Rajoo, Singapore (SG); Frank G. Kuechenmeister, Dresden (DE); Dirk Breuer, Dresden (DE)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 119 days.

(21) Appl. No.: 17/114,894

(22) Filed: Dec. 8, 2020

(65) Prior Publication Data
US 2022/0181271 A1  Jun. 9, 2022

(51) Int. Cl.
*H01L 23/00* (2006.01)
*H01L 21/78* (2006.01)

(52) U.S. Cl.
CPC ............ *H01L 23/562* (2013.01); *H01L 21/78* (2013.01)

(58) Field of Classification Search
CPC ..... H01L 23/562; H01L 21/78; H01L 23/564; H01L 23/585; H01L 21/48
See application file for complete search history.

(56) References Cited

U.S. PATENT DOCUMENTS

| | | | |
|---|---|---|---|
| 5,665,655 A | 9/1997 | White | |
| 8,283,193 B2 | 10/2012 | Tan et al. | |
| 8,531,008 B2 | 9/2013 | Fischer et al. | |
| 8,833,571 B2 | 9/2014 | Anderson | |
| 8,841,753 B2 | 9/2014 | Takemura et al. | |
| 8,896,102 B2 | 11/2014 | Zhang et al. | |
| 9,685,416 B2 | 6/2017 | Yoshizawa et al. | |
| 10,546,822 B2 | 1/2020 | Polomoff et al. | |
| 2008/0083959 A1* | 4/2008 | Wu | H01L 21/78 |
| | | | 257/416 |
| 2015/0155263 A1* | 6/2015 | Farooq | H01L 23/562 |
| | | | 438/109 |

* cited by examiner

*Primary Examiner* — Thanh T Nguyen
(74) *Attorney, Agent, or Firm* — Anthony Canale; Andrew M. Calderon; Calderon Safran & Cole, P.C.

(57) ABSTRACT

The present disclosure relates to semiconductor structures, and more particularly, to crackstop structures and methods of manufacture. The structure includes: a die matrix comprising a plurality of dies separated by at least one scribe lane; and a crackstop structure comprising at least one line within the at least one scribe lane between adjacent dies of the plurality of dies.

15 Claims, 8 Drawing Sheets

CRACKSTOP STRUCTURES

FIELD OF THE INVENTION

The present disclosure relates to semiconductor structures, and more particularly, to crackstop structures and methods of manufacture.

BACKGROUND

In a matrix die, identical dies are electrically connected via active (i.e., Rx) layers or back end of the line (BEOL) layers electrically connected to a substrate. During the assembly of matrix dies, though, die edges may be exposed. Due to this exposure, there is a risk of chip-package interaction (CPI) failures due to moisture ingress and weak mechanical production at the die edges.

More specifically, during a reflow process of matrix dies, cracking and moisture can occur and penetrate the active die matrix. Depending on the amount of moisture during the reflow process, the moisture can compromise the integrated circuits, e.g., active die matrix. Further, during the dicing process, cracking or chipping of a matrix die can occur and propagate into the die even if there is a crackstop within the specific die.

Moreover, in known circuit designs, moisture can diffuse through an exposed scribe lane in a die matrix structure and lead to reliability issues. The moisture can lead to weak mechanical protection and cracks and chipping. The moisture ingress and weak mechanical protection increases as the die matrix configuration (i.e., square or rectangular) increases (i.e., 2×2, 1×2, 3×3, 4×4, 5×5, 6×6, etc.)

SUMMARY

In an aspect of the disclosure, a structure comprises: a die matrix comprising a plurality of dies separated by at least one scribe lane; and a crackstop structure comprising at least one line within the at least one scribe lane between adjacent dies of the plurality of dies.

In another aspect of the disclosure, a structure comprises: a wafer comprising a plurality of dies with a scribe lane on sides of the plurality of dies; and a plurality of stacked metal lines extending within and parallel to the scribe lanes and which intersect at a corner of each die of the plurality of dies.

In another aspect of the disclosure, a method comprises forming a crackstop structure comprising at least one metal line within at least one scribe lane between adjacent dies of the plurality of dies.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures, and more particularly, to crackstop structures and methods of manufacture. In embodiments, the crackstop structures are provided at a wafer level to protect dies in a die matrix. The crackstop structures can be separate structures within a scribe lane, connect to existing crackstop structures of dies in the die matrix and, in embodiments, can include crossing arrangements within the scribe lane at junctions of multiple dies, amongst other patterns.

In more specific embodiments, a first crackstop structure can be in the scribe lane crossing and connecting to a second crackstop structure in another scribe lane. The first and second crackstop structures can be orthogonal crackstop structures that cross at a junction of two or more dies. In embodiments, the crackstop structures can be provided in each scribe lane, which crossover providing a single or double crossing pattern. In still further embodiments, the crackstop structures can extend orthogonal or at other angles, e.g., 45°, within the scribe lane, or can extend between and connect to crackstop structures of adjacent dies. Moreover, the crackstop structures can be extensions of crackstop structures of each individual die, with the crackstop structures crossing at a junction of two or more dies.

Accordingly and advantageously, the crackstop structures have a robust design from a chip-package interaction (CPI) standpoint. In particular, the crackstop structures for a die matrix assembly can be a primary crackstop structure or a secondary crackstop structure or moisture oxidation barrier (MOB). The crackstop structures can also be implemented in any shape die matrix (i.e., any die size, any technology node, and different function dies). The crackstop structures can also be used for both wide scribe lanes and narrow scribe lanes. Also, in each of the different embodiments described herein, the crackstop structures include a repetitive pattern throughout the entire wafer such that each die matrix from the single wafer includes a same pattern of crackstop structures.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
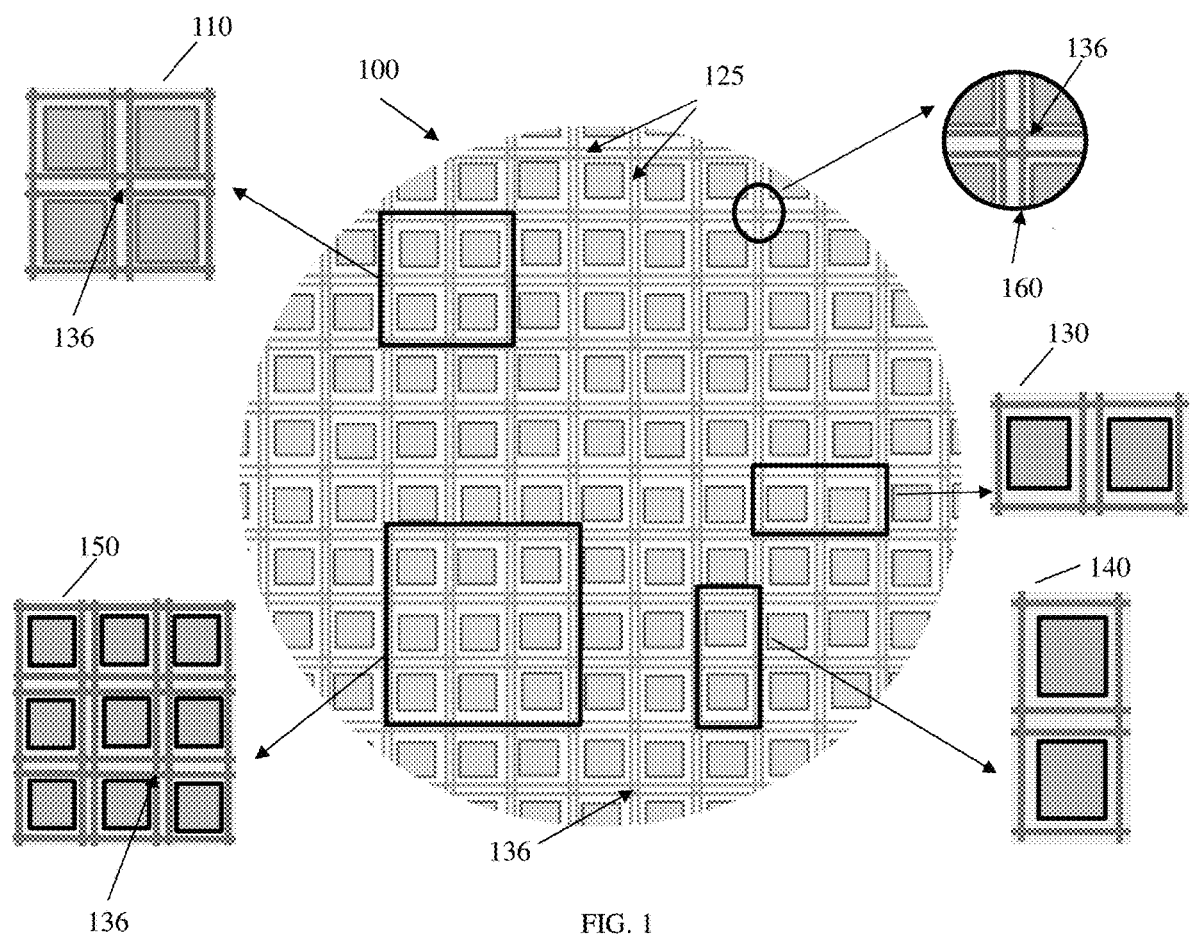
FIG. 1 shows a crackstop structure in a scribe lane of a wafer, amongst other features, and respective fabrication processes in accordance with aspects of the present disclosure.

FIG. 1 shows a universal crackstop structure, amongst other features, and respective fabrication processes. In FIG.

1, a crackstop structure 160 can be provided at a wafer level 100 as shown in die matrices 110, 130, 140, and 150 of different sized die matrix arrangements. More specifically, as shown in the embodiment of FIG. 1, the crackstop structures 160 comprises parallel stacked metal lines used for any die matrix (i.e., 2×2 die matrix 110, a 2×1 die matrix 130, a 1×2 die matrix 140, a 3×3 die matrix 150, combinations thereof, etc.), implemented within a scribe lane 125 of certain width (e.g., 80 μm or above). The crackstop structure 160 extends between and surrounds each die, providing mechanical protection while also preventing moisture ingress into the die, itself. Also, as in each of the embodiments, the crackstop structure 160 can be repetitive throughout the wafer level 100.

The crackstop structure 160 comprises parallel metal lines in the scribe lanes 125, with a double crossing pattern 136 at a junction of four adjacent dies. In this embodiment, the two parallel lines in the scribe lanes 125 are remotely positioned from the dies (e.g., do not contact the dies or any of its features, e.g., crackstop structure). The two parallel lines in the scribe lanes 125 run horizontally and vertically, e.g., orthogonal, to each other in the respective horizontal and vertical scribe lanes 125 so as to cross at the junction 136 of adjacent dies. As in each of the different embodiments, the crackstop structure 160 (including the double crossing pattern) prevents moisture ingress into the individual dies and can comprise a stack of metal layers within the scribe lanes 125. The crackstop structures 160 can include many different shapes including, e.g., via bars or interconnects, as in standard moisture oxide barrier (MOB) structures to prevent moisture ingress.

In embodiments, the metal layers within the scribe lane 125 can be a plurality of stacked metal interconnections, e.g., layers, formed by conventional CMOS technologies. More specifically, at each wiring layer of the die, metal layers can be fabricated within the scribe lanes 125 in a stacked arrangement, one on top of another, using conventional lithography, etching and deposition methods known to those of skill in the art. For example, a resist formed over a first insulator layer is exposed to energy (light) to form a pattern (opening). An etching process with a selective chemistry, e.g., reactive ion etching (RIE), can be used to form one or more trenches in the insulator material through the openings of the resist. Following resist removal by a conventional oxygen ashing process or other known stripants, metal material or combinations thereof, e.g., copper, aluminum, metal alloys, etc., can be deposited by any conventional deposition processes, e.g., chemical vapor deposition (CVD). Any residual material on the surface of the insulator material can be removed. This same process can be repeated for all subsequent metal layers to form a crackstop structure 160 within the scribe lanes 125.

Figure 2:
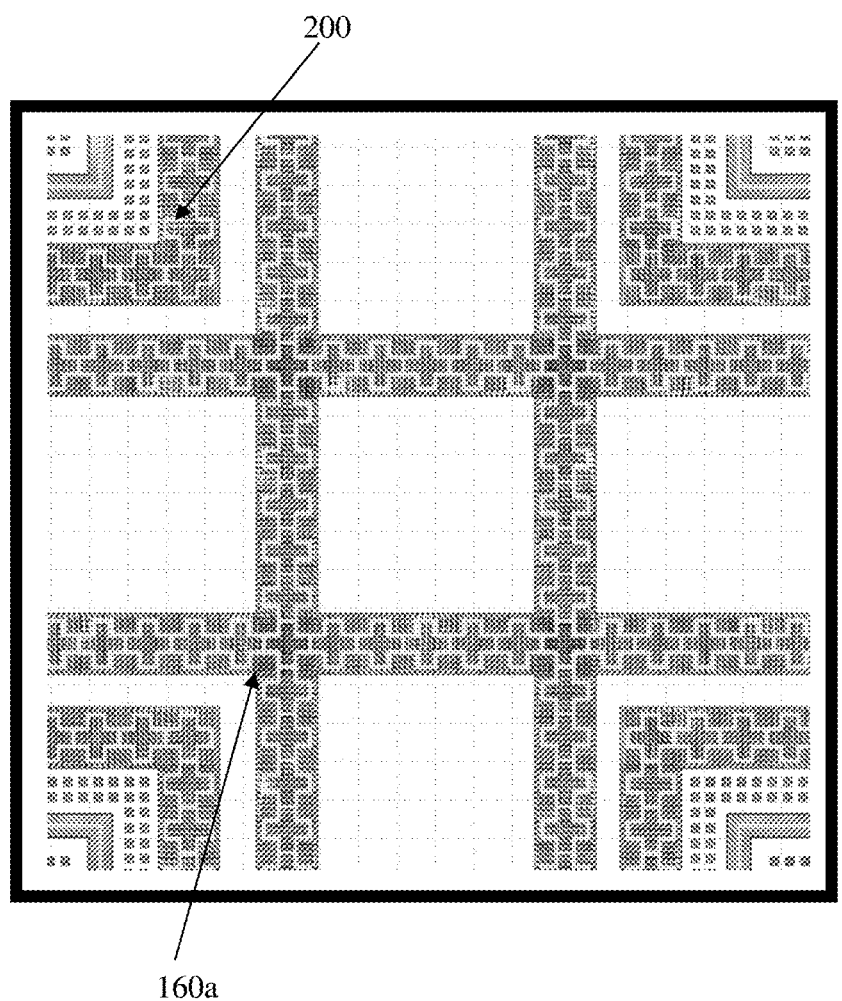
FIG. 2 shows a pattern of the crackstop structure, amongst other features, and respective fabrication processes in accordance with aspects of the present disclosure.

In FIG. 2, the crackstop structure 160a includes a plurality of via bars. The via bars are similar to the arrangement of the crackstop structures 200 of the individual dies; however, they remain a separate structure remote from the crackstop structures 200. In this way, the masks used for the crackstop structures 160a, 200 can include a same pattern. The remaining features are similar to that already described with respect to FIG. 1.

Figure 3:
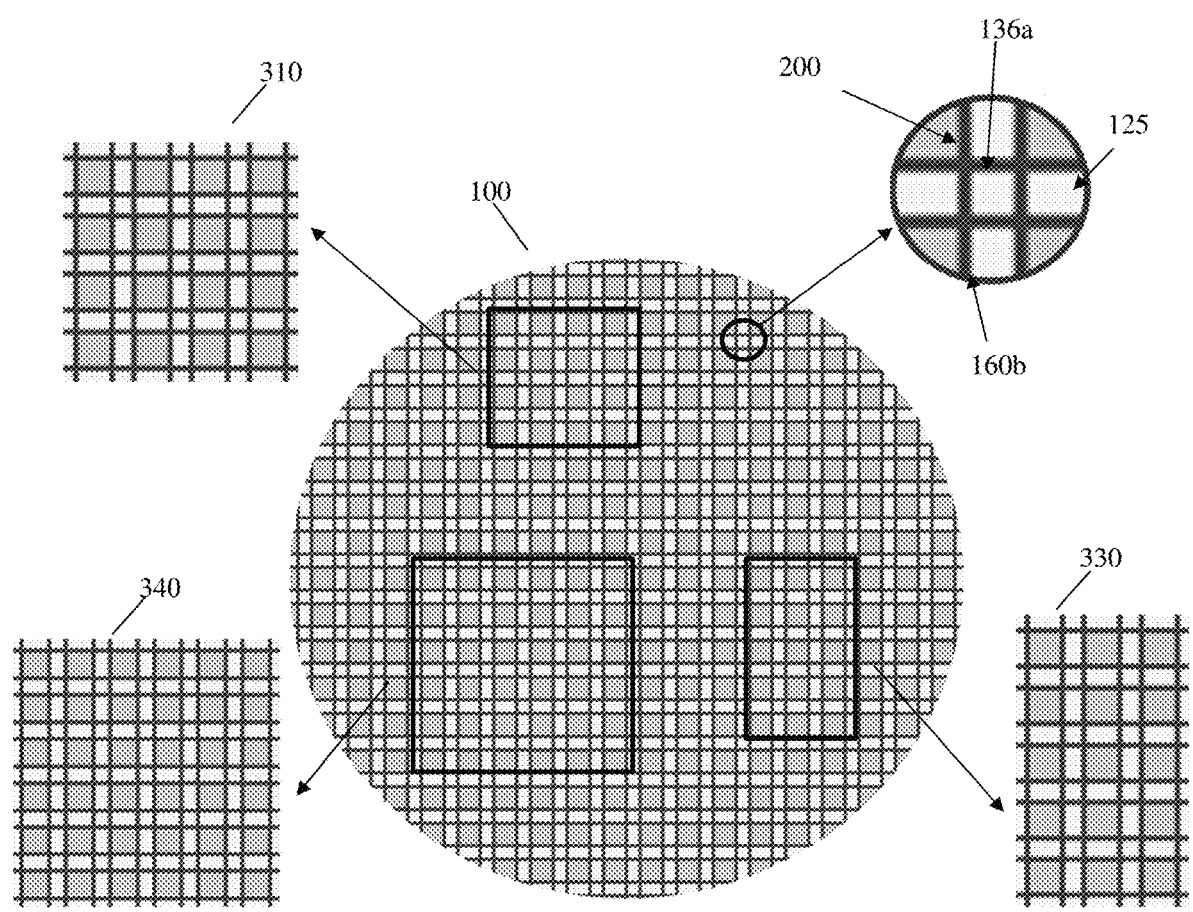
FIG. 3 shows another crackstop structure, amongst other features, and respective fabrication processes in accordance with aspects of the present disclosure.

FIG. 3 shows an alternative crackstop structure, amongst other features. For example, in FIG. 3, the crackstop structure 160b includes a single metal line which extends from each of the dies in each of the scribe lanes 125. In this embodiment, for example, the crackstop structures 160b are extensions of the crackstop structures of each of the dies, extending into the junctions of the dies crossing over each other in a single crossing pattern as shown at reference numeral 136a. More specifically, the metal lines extend from corners of the crackstop structures 200 of each of the dies.

In the embodiment shown in FIG. 3, as an example, the metal lines extend entirely across the scribe lanes 125, e.g., crackstop structure 136a, at corner of each adjacent die. This arrangement effectively prevents moisture from entering into the scribe lanes 125 which, in turn, reduces or eliminates moisture, Csat, between adjacent dies of the matrix during storage or other post dicing activities. And, by reducing or eliminating the moisture content, it is now possible to prevent crack propagation during die packaging processes, e.g., during reflow that occurs during molding, board mounting, etc., that would otherwise occur should moisture be allowed to accumulate within the scribe lanes 125.

As with each of the embodiments, the crackstop structures 160b can be provided within die matrixes 310, 330, and 340 of different sizes or arrangements. For illustrative purposes and not to be a limiting feature of the present disclosure, the crackstop structure 160b can be used for any square or rectangular die matrix (i.e., 4×4 die matrix 310, a 3×5 die matrix 330, a 6×6 die matrix 340, etc.) and is ideal for a small die size and narrow scribe lane width (e.g., below 80 μm). Also, the crackstop structure 160b can be a same or different pattern than the crackstop pattern in each of the dies, e.g., via bars.

Figure 4:
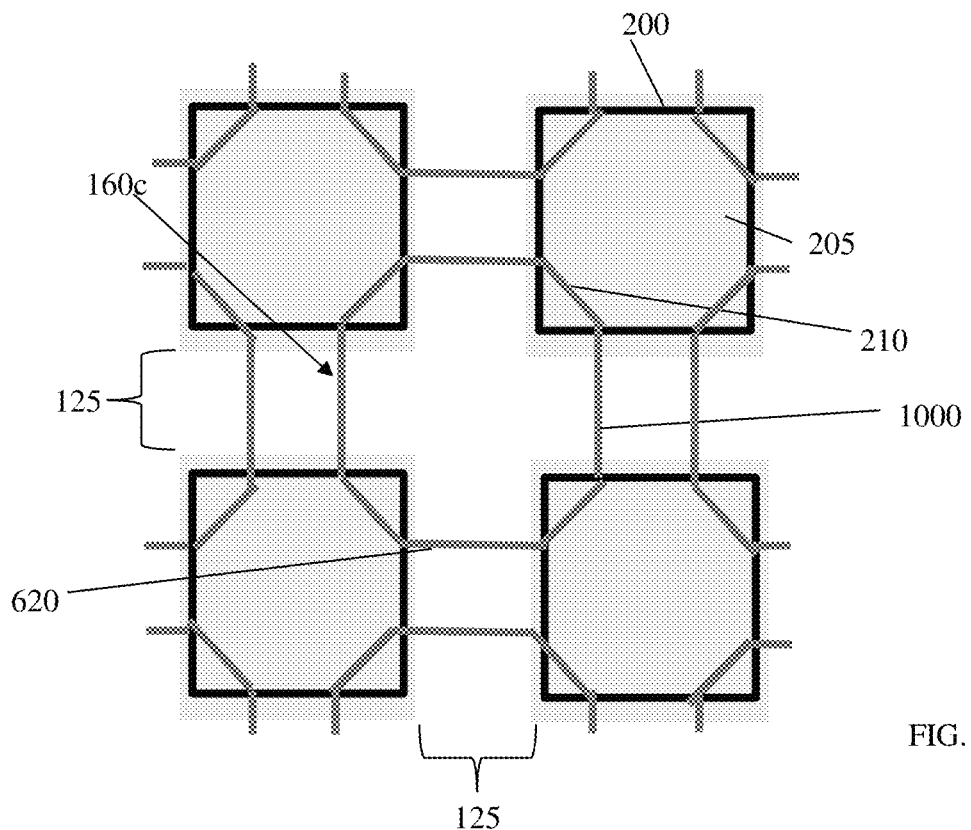
FIG. 4 shows a crackstop structure with an octagonal pattern, amongst other features, and respective fabrication processes in accordance with aspects of the present disclosure.

FIG. 4 shows a die matrix with crackstop structure 160c comprising an octagonal pattern 1000 between and extending at a junction of four dies 205. Although the die matrix is shown as a 2×2 matrix, it should be understood by those of skill in the art that as in any of the embodiments described herein, the die matrix can be 2×1 or greater. In any of these arrangements, the octagonal pattern 1000 includes metal lines 620 extending across the entirety of each scribe lane 125. In embodiments, the metal lines 620 connect to a metal line 210 extending at a 45° angle within the dies 205. In embodiments, the metal line 210 comprises an existing chamfer of the crackstop structure 200 of the dies 205.

In embodiments, the metal line 210 provides additional mechanical protection while also preventing moisture ingress into the active area of the die 205, itself. In any of the embodiments that implement a chamfer of the die, e.g., metal line 210 of the existing die, the chamfer can be included in large dies for mechanical strength; whereas, in smaller dies, the chamfer can be removed to provide additional space for the active area.

Still referring to FIG. 4, the metal lines 620 prevent moisture ingress from entering into the entirety of the scribe lanes 125. More specifically, as with the embodiment shown in FIG. 3, the metal lines 620 prevent moisture from entering into the scribe lanes 125 between adjacent dies 205. This, in turn, significantly reduces or eliminates moisture, Csat, from accumulating within the scribe lanes 125 between adjacent dies during storage or other post dicing activities. And, by reducing or eliminating the moisture, crack propagation can be prevented during die packaging processes.

Figure 5:
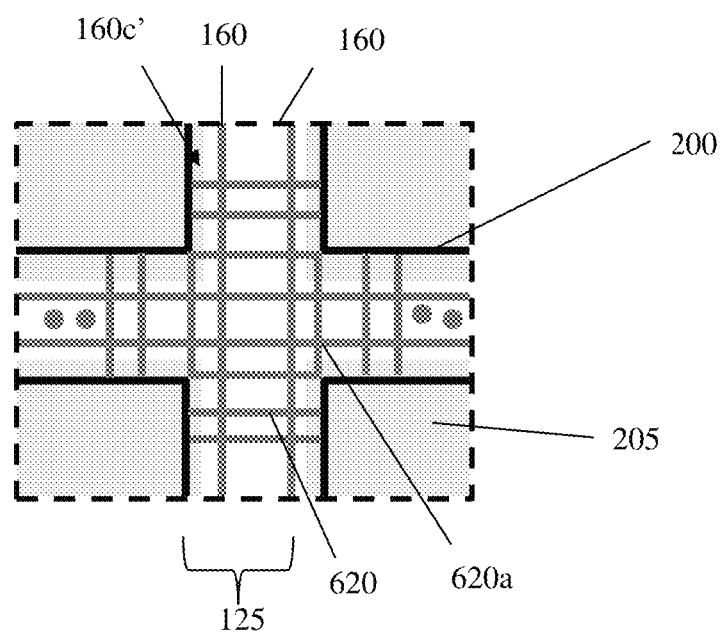
FIGS. 5-11 show alternative crackstop patterns, amongst other features, and respective fabrication processes, in accordance with aspects of the present disclosure.

FIG. 5 shows a die matrix with crackstop structure 160c' extending across scribe lanes 125. In this embodiment, the crackstop structure 160c' includes a combination of the crackstop structure 160 shown in FIG. 1 (e.g., parallel metal lines), in additional to metal lines 620, 620a extending across the scribe lanes 125 and connecting to the crackstop structures 200 of the individual dies 205. In embodiments, the additional metal lines 620, 620a can be any predetermined number (e.g., 2, 3, 4, etc.) of metal lines extending across the scribe lanes 125 and between the crackstop structures 200.

In this arrangement, the parallel metal lines 620, 620a extend across each of the vertical and horizontal scribe lanes 125, with the innermost metal lines 620a being at a junction of four dies (e.g., at a corner of each die). The parallel metal lines 620, 620a connect to the crackstop structures 200 of the dies. In embodiments, the innermost metal lines 620a are arranged similarly to the metal lines shown in FIG. 3, e.g., from the corner of each due. Again, as described with the embodiment shown in FIG. 3, the metal lines 620 significantly reduce and, in the case of metal lines 620a eliminate moisture, Csat, from entering into the scribe lanes 125 between adjacent dies, thereby preventing crack propagation during post dicing processes. For example, in this arrangement, at least the metal lines 620a extending across the scribe lanes 125 prevent moisture from entering any portion of the scribe lanes between the adjacent dies, hence reducing the moisture content and eliminating crack propagation during post dicing activities.

Figure 6:
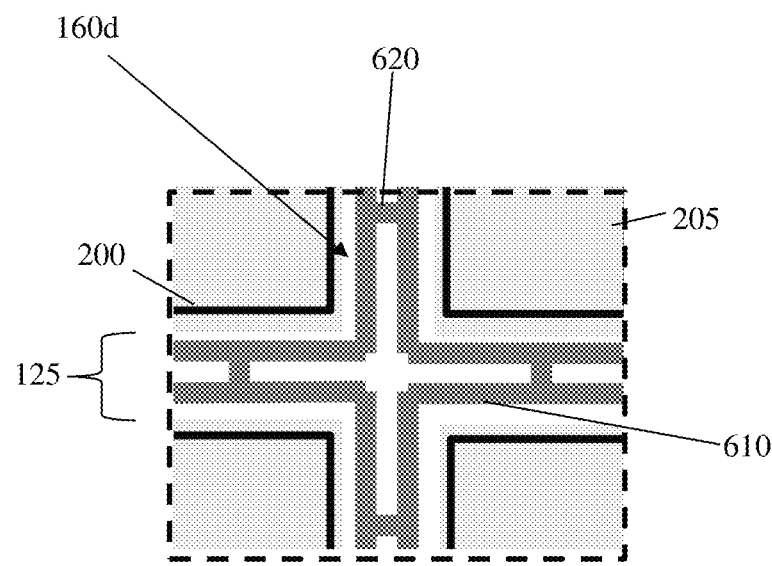

In FIG. 6, the crackstop structure 160d includes two parallel metal lines 610 (e.g., crackstop structures) within each scribe lane 125, in addition to metal lines 620 (e.g., crackstop structures) extending across the scribe lanes 125 and connecting to the parallel metal lines 610. In embodiments, the metal lines 610, 620 meet at an approximate 90° angle along a length of the dies 205 within the scribe lanes 125. In this arrangement, the metal lines 620 extend across the scribe lanes 125 to prevent moisture from completely entering into the scribe lanes 125 between the adjacent dies, hence reducing the moisture content and crack propagation during post dicing activities. That is, the metal lines 620 extending across the scribe lanes 125 will only allow moisture to enter into a portion of the scribe lanes 125, hence reducing moisture content and preventing crack propagation during post dicing activities.

Figure 7:
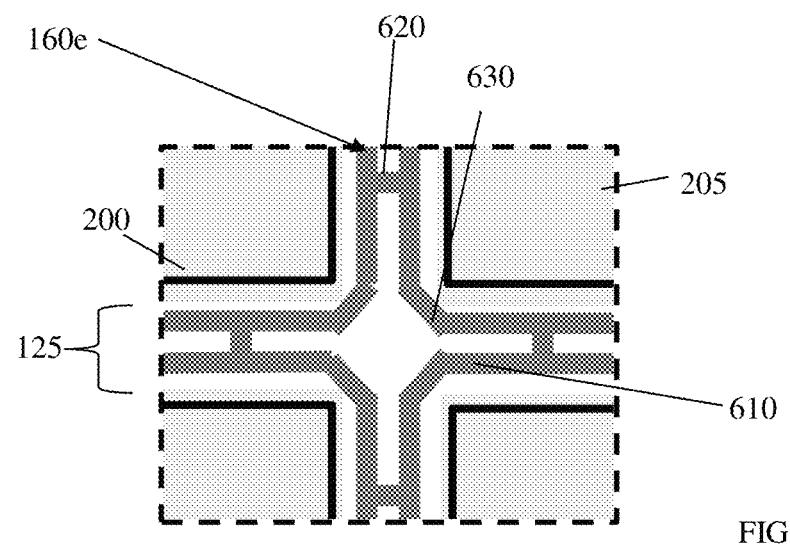

In FIG. 7, the crackstop structure 160e includes two parallel metal lines 610 (e.g., crackstop structures) within each scribe lane 125, with the metal lines 620 (e.g., crackstop structures) extending across the scribe lanes 125 and connecting to the parallel metal lines 610. In addition, the metal lines 610 (e.g., crackstop structures) meet at metal lines 630 positioned at an approximate 45° angle at each corner of the individual dies 205. In this arrangement, the metal lines 620, 630 extend across the scribe lanes 125 to prevent moisture from entering into between the scribe lanes 125 and the adjacent dies, hence reducing the moisture content and crack propagation during post dicing activities.

Figure 8:
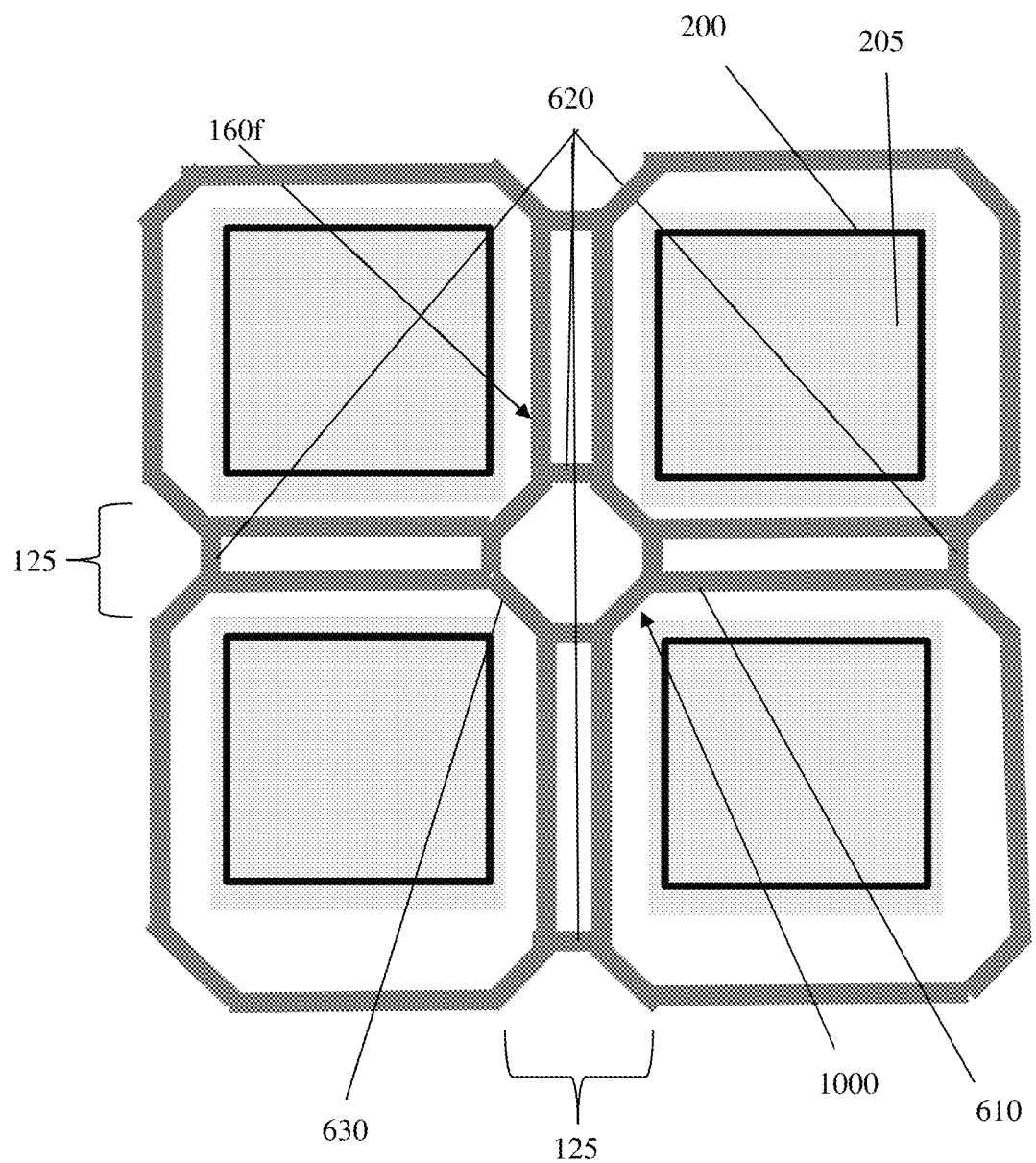

In the crackstop structure 160f of FIG. 8, two parallel metal lines 610 (e.g., crackstop structures) are provided within each scribe lane 125, in addition to an octagonal structure 1000 at a junction of four dies 205. In embodiments, the octagonal structure 1000 includes the metal lines 620, 630. In this arrangement, the metal lines 620 are at each corner of the individual dies 205 and, similar to that described with respect to FIG. 7, the metal lines 630 are arranged at an approximate 45° angle. Also, the metal lines 620 connect to both the metal lines 610 and 630. In this arrangement, the metal lines 620 extend across the scribe lanes 125 to prevent moisture from entering into an entirety of scribe lanes 125 between the adjacent dies, hence reducing the moisture content and crack propagation during post dicing activities. In addition, the metal lines 610 prevent moisture from entering into the individual dies 205.

Figure 9:
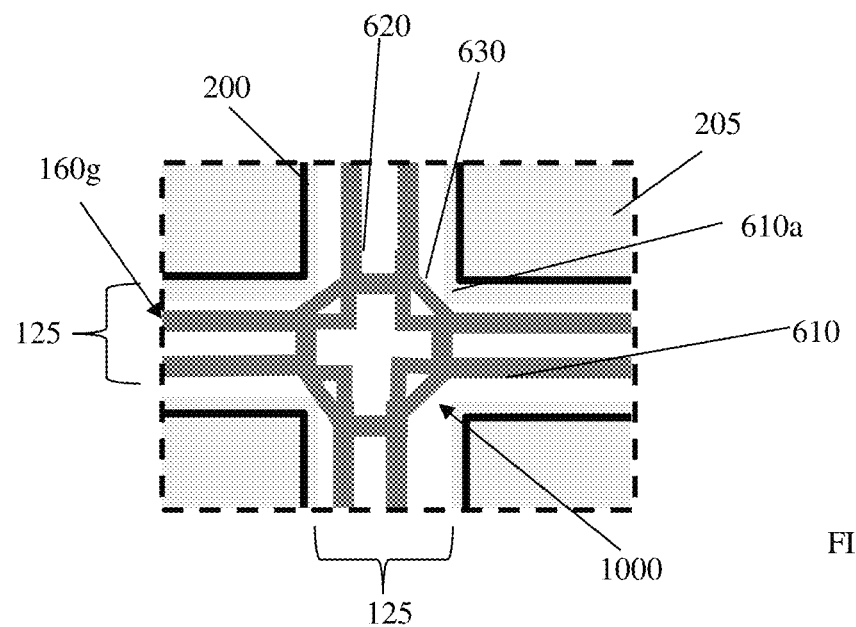

In FIG. 9, the crackstop structure 160g includes two parallel metal lines 610 (e.g., crackstop structures) within each scribe lane 125, in addition to metal lines 620, 630 forming an octagonal pattern 1000 at a junction of four dies 205. In this arrangement, though, the (e.g., crackstop structures) the parallel metal lines 610 extend within the octagonal pattern 1000 comprising the metal lines 620, 630 at each corner of the individual dies 205. Also, in this embodiment, the metal lines 620, 630 (e.g., crackstop structures) connect to the metal lines 610 along a length of adjacent dies 205. In addition, metal lines 630 (e.g., crackstop structures) meet at an approximate 45° angle at each corner of the individual dies 205, connecting to the metal lines 620. Again, in this arrangement, the metal lines 620 extend across the scribe lanes 125 to prevent moisture from entering through the entirety of scribe lanes 125 between the adjacent dies, hence reducing the moisture content and crack propagation during post dicing activities. In addition, the metal lines 610 prevent moisture from entering into the individual dies 205 after the dicing operation.

Figure 10:
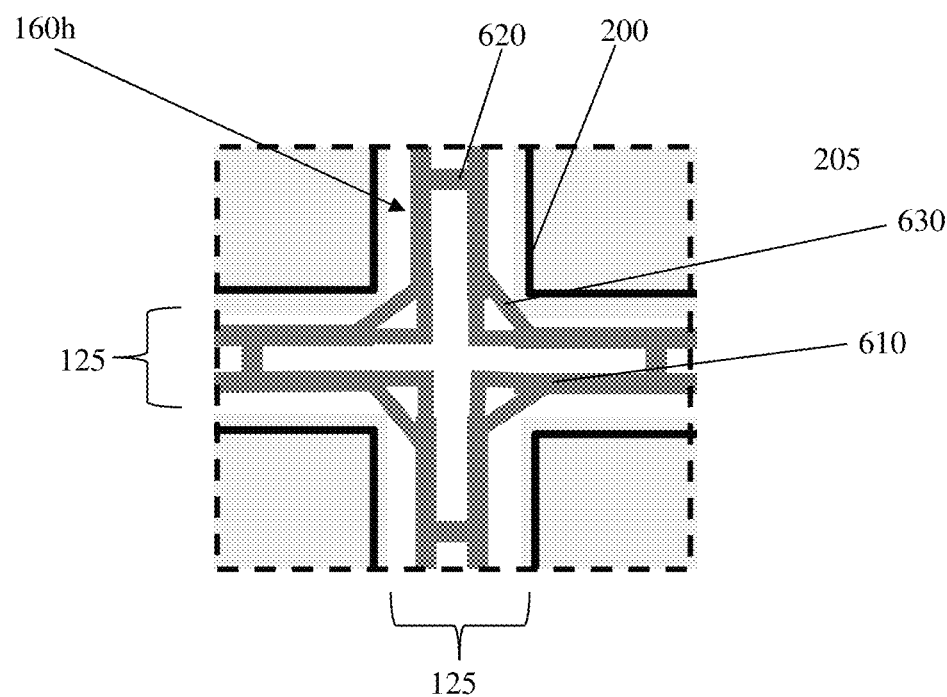

FIG. 10 shows a crackstop structure 160h which includes two parallel metal lines 610 (e.g., crackstop structures) within each scribe lane 125, in addition to metal lines 620 extending between and connecting to the parallel metal lines 610 within the scribe lane 125. In addition, the metal lines (e.g., crackstop structures) 610 connect to the metal lines 620 provided at an approximate 90° angle near an end of each individual die 205. In this scenario, the metal lines 620 do not connect to the metal lines 630. As in previous embodiments, the metal lines 620 extend across the scribe lanes 125 to prevent moisture from entering into a portion of the scribe lanes 125 between the adjacent dies, hence reducing the moisture content and crack propagation during post dicing activities. In addition, the metal lines 610 prevent moisture from entering into the individual dies 205 after the dicing operation.

Figure 11:
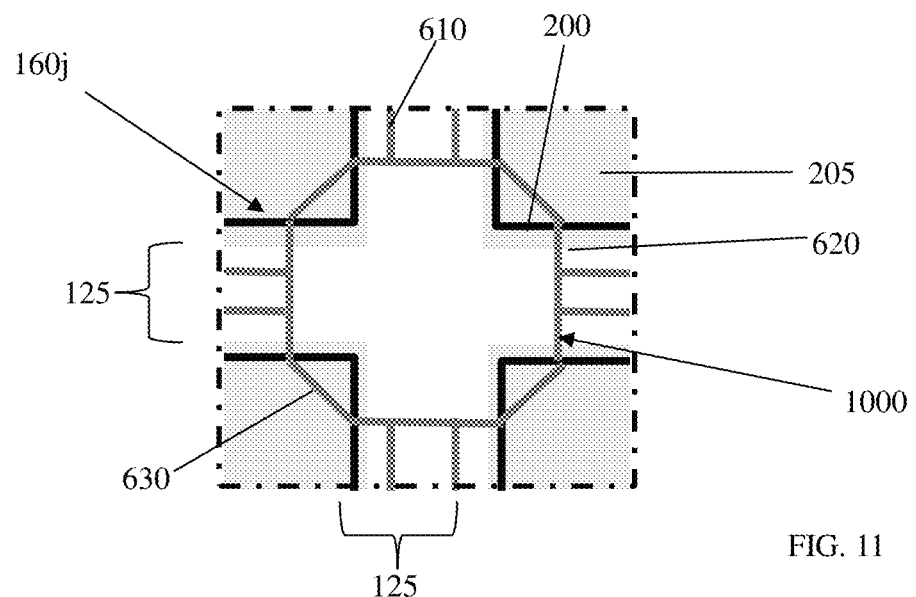

FIG. 11 shows a crackstop structure 160j which includes parallel metal lines 610 extending within the respective horizontal and vertical scribe lanes 125, in addition to the octagonal pattern 1000. As in FIG. 4, the octagonal pattern 1000 includes metal lines 620 extending entirely across each of the scribe lanes 125 and connected to a chamfered metal line 630 of the dies 205 (e.g., metal line extending within the die 205 at a 45° angle). In embodiments, the metal lines 620 of the octagonal pattern 1000 prevent moisture ingress into the scribe lanes 125 as already described, in addition to the metal lines 610 preventing moisture from entering into the dies 205 after the dicing operation.

Figure 12:
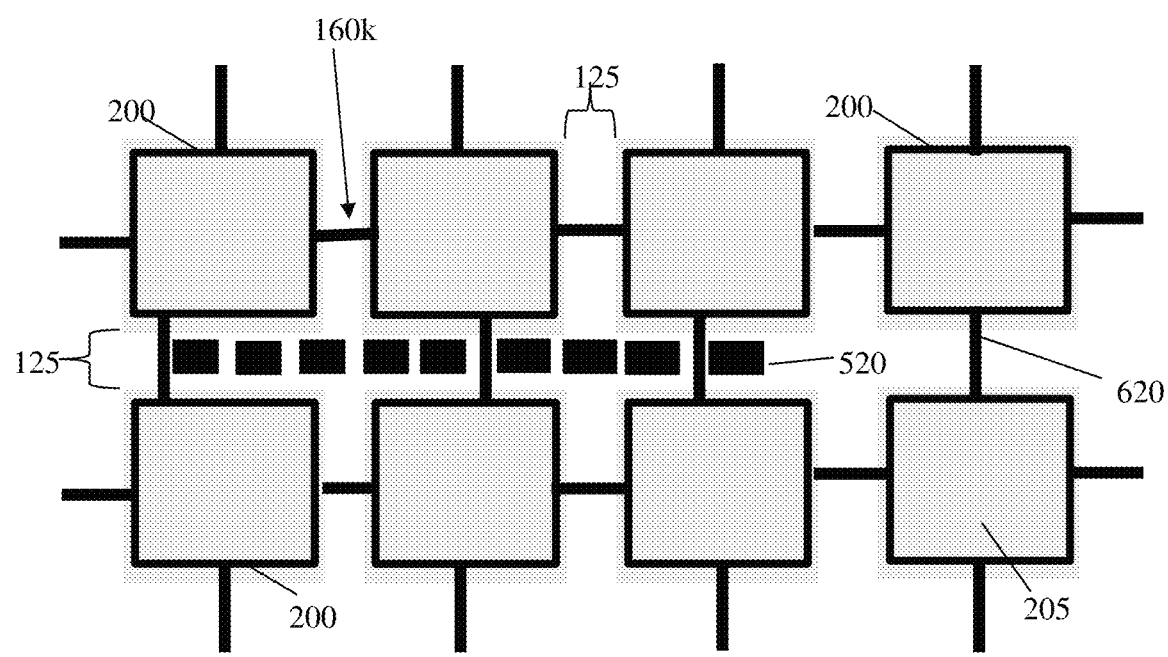
FIG. 12 shows a crackstop structure with test pads, amongst other features, and respective fabrication processes in accordance with aspects of the present disclosure.

FIG. 12 shows test pads, test circuits, identification marks, optical alignment marks or other structures within the scribe lanes 125, each of which are represented by reference numeral 520. In embodiments, the crackstop structure 160k surrounds the structures 520 and includes metal lines 620 that extend across the scribe lanes 125 along a length of each of the dies 205. The metal lines 620 connect to the crackstop structures 200 of each of the dies 205. In this embodiment, as can be the case with other aspects of the present disclosure, the metal lines 620 are not placed at the corners of the dies 205; instead, the metal lines 620 are placed along a side of the dies 205 due to the location of the structures 520. In any case, the metal lines 620 prevent moisture from entering within a portion of the scribe lanes 125 between the adjacent dies 205, hence reducing the moisture content and eliminating crack propagation during post dicing activities. The metal lines 620 in combination with the crackstop structures 200 also prevent moisture from entering into the individual dies 205.

The crackstop structure described herein can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a die matrix comprising a plurality of dies separated by at least one scribe lane; and
    a crackstop structure comprising at least one line within the at least one scribe lane between adjacent dies of the plurality of dies; and
    an octagonal metal line or segment thereof, at a corner of adjacent dies of the plurality of dies,
    wherein the at least one line includes two parallel metal lines extending in a first scribe lane and two parallel metal lines extending within a second scribe lane, and
    the two parallel metal lines in the first scribe lane and the two parallel metal lines in the second scribe lane extend to and contact with the octagonal metal line.

2. The structure of claim 1, wherein the two parallel metal lines in the first scribe lane crossover the two parallel metal lines in the second scribe lane.

3. The structure of claim 1, wherein the two parallel metal lines in the first scribe lane and the two parallel metal lines in the second scribe lane are separated from crackstop structures of the plurality of dies.

4. The structure of claim 1, further comprising at least one metal line extending across the first scribe lane and the second scribe lane.

5. The structure of claim 4, wherein the at least one metal line extending across the first scribe lane and the second scribe lane extends between the two parallel metal lines in the first scribe lane and the two parallel metal lines in the second scribe lane.

6. The structure of claim 4, wherein the at least one metal line extending across the first scribe lane and the second scribe lane connect to crackstop structures of adjacent dies of the plurality of dies.

7. The structure of claim 1, wherein a segment of the octagonal metal line comprises a chamfered crackstop structure within the adjacent dies of the plurality of dies.

8. The structure of claim 1, wherein the at least one line comprises the octagonal metal line or segment thereof at the corner of adjacent dies of the plurality of dies.

9. The structure of claim 1, wherein the at least one line within the at least one scribe lane connects to the crackstop structure of adjacent dies of the plurality of dies at a corner.

10. A structure, comprising:
    a die matrix comprising a plurality of dies separated by at least one scribe lane;
    a crackstop structure comprising at least one line within the at least one scribe lane between adjacent dies of the plurality of dies,
    wherein the at least one line includes two parallel metal lines extending in a first scribe lane and two parallel metal lines extending within a second scribe lane,
    at least one metal line which extends across the first scribe lane and the second scribe lane, and
    the at least one metal line extending across the first scribe lane and the second scribe lane extend from corners of adjacent dies of the plurality of dies.

11. A structure, comprising:
    a wafer comprising a plurality of dies with a scribe lane on sides of the plurality of dies; and
    a plurality of stacked metal lines extending within and parallel to the scribe lanes and which intersect at a corner of each die of the plurality of dies,
    wherein the plurality of stacked metal lines extending within and parallel to the scribe lanes comprise a single stacked metal line extending across each of the scribe lanes, and which extend from a corner of the each die of the plurality of dies.

12. The structure of claim 11, wherein the single stacked metal line in each of the scribe lanes connect to a crackstop structure of the each die of the plurality of dies.

13. The structure of claim 11, wherein the plurality of stacked metal lines extending within and perpendicular to the scribe lanes extend to crackstop structures of adjacent dies on the wafer.

14. The structure of claim 11, further comprising at least one additional metal line extending across each of the scribe lanes.

15. The structure of claim 14, wherein the metal lines connect to a crackstop structure of the each die of the plurality of dies.

* * * * *